(12) United States Patent
Perrenoud et al.

(10) Patent No.: US 11,988,551 B2
(45) Date of Patent: May 21, 2024

(54) DEVICE AND SYSTEM FOR SINGLE PHOTON DETECTION USING A PLURALITY OF SUPERCONDUCTING DETECTION MEANS CONNECTED IN PARALLEL

(71) Applicants: Université de Genève, Geneva (CH); ID Quantique SA, Carouge (CH)

(72) Inventors: Matthieu Perrenoud, Saint-Julien-en-Genevois (FR); Félix Bussières, Vessy (CH); Misael Caloz, Carouge (CH)

(73) Assignees: Université de Genève, Geneva (CH); ID Quantique SA, Carouge (CH)

( * ) Notice: Subject to any disclaimer, the term of this patent is extended or adjusted under 35 U.S.C. 154(b) by 195 days.

(21) Appl. No.: 17/615,020

(22) PCT Filed: Jun. 16, 2020

(86) PCT No.: PCT/EP2020/066591
§ 371 (c)(1),
(2) Date: Nov. 29, 2021

(87) PCT Pub. No.: WO2021/004733
PCT Pub. Date: Jan. 14, 2021

(65) Prior Publication Data
US 2022/0236108 A1    Jul. 28, 2022

(30) Foreign Application Priority Data
Jul. 11, 2019    (EP) ..................................... 19185824

(51) Int. Cl.
*G01J 1/42*    (2006.01)
*H10N 60/30*    (2023.01)
(Continued)

(52) U.S. Cl.
CPC ............ *G01J 1/4228* (2013.01); *H10N 60/30* (2023.02); *H10N 60/84* (2023.02); *G01J 2001/442* (2013.01)

(58) Field of Classification Search
CPC ...... G01J 1/4228; G01J 2001/442; G01J 1/44; G01J 5/20; G01J 2005/208; H10N 60/30; H10N 60/84
See application file for complete search history.

(56) References Cited

U.S. PATENT DOCUMENTS

| | | | |
|---|---|---|---|
| 5,331,162 A * | 7/1994 | Silver | H10N 60/84 505/848 |
| 7,049,593 B2 | 5/2006 | Sobolewski et al. | |
| 2014/0087952 A1* | 3/2014 | Nam | G01J 1/0425 505/181 |

FOREIGN PATENT DOCUMENTS

| | | |
|---|---|---|
| CN | 106289515 A | 1/2017 |
| JP | 2013-019777 A | 1/2013 |

(Continued)

OTHER PUBLICATIONS

Hu, Xiaolong, et al., "Timing properties of superconducting nanowire single-photon detectors," *Proceedings of SPIE*, vol. 11027, 13 pages (Apr. 30, 2019).

(Continued)

*Primary Examiner* — Kiho Kim
(74) *Attorney, Agent, or Firm* — Christensen, Fonder, Dardi & Herbert PLLC

(57) ABSTRACT

A device for single-photon detection comprising two superconducting detectors, a bias-current source, a filter element and a readout circuit. Each detector forms a detection area for absorption of incident photons and is connected in parallel; each detector being maintained below its critical temperature and provided with an electrical bias current situated close to and below its critical current so as to be (Continued)

maintained in a non-resistive superconducting state, and configured to transition, at photon absorption, from the non-resistive state to a resistive state due to an increase in current density within the detector above the critical current. The readout circuit senses a voltage change corresponding to the, allowing creation of an event signal for each absorption of an incident photon by a detector. The device includes a current-redistribution portion for redistributing current arising after absorption of incident photons so as to avoid increases in current density above the critical current.

18 Claims, 5 Drawing Sheets

(51) Int. Cl.
*H10N 60/84* (2023.01)
*G01J 1/44* (2006.01)

(56) References Cited

FOREIGN PATENT DOCUMENTS

| JP | 2016-085867 A | 5/2016 |
|---|---|---|
| RU | 2 327 353 C2 | 6/2008 |

OTHER PUBLICATIONS

Chi, Xiaoming, et al., "RF-amplifier-free superconducting nanowire single-photon detector system," *2018 Asia Communications and Photonics Conference*, 3 pages (Oct. 26, 2018).

* cited by examiner

DEVICE AND SYSTEM FOR SINGLE PHOTON DETECTION USING A PLURALITY OF SUPERCONDUCTING DETECTION MEANS CONNECTED IN PARALLEL

PRIORITY CLAIM

The present application is a National Phase entry of PCT Application No. PCT/EP2020/066591, filed Jun. 16, 2020, which claims priority from European Patent Application Number 19185824.0, filed Jul. 11, 2019, the disclosures of which are hereby incorporated by reference herein in their entirety.

FIELD OF THE INVENTION

The present invention pertains to a device for single photon detection, the device comprising at least two superconducting detection means as well as a bias current source, a filter element and a readout circuit, wherein each superconducting detection means forms a detection area adapted for absorption of incident photons and is connected in parallel to said bias current source and to said readout circuit by the intermediate of said filter element, each superconducting detection means being maintained at a temperature below its critical temperature, said bias current source providing each superconducting detection means with an electrical bias current situated close to and below a critical current of the superconducting detection means such as to normally maintain each superconducting detection means in a non-resistive superconducting state, each superconducting detection means being adapted to transition, in case of absorption of an incident photon, from said non-resistive superconducting state to a resistive state, and said readout circuit being adapted to sense a voltage change corresponding to said transition of the superconducting detection means into its resistive state, such as to allow to create an event signal for each absorption of an incident photon by any of said superconducting detection means.

BACKGROUND OF THE INVENTION

In general, the present invention concerns techniques and devices for single photon detection. Nowadays many applications, such as quantum key distribution, optical free-space communication or optical time-of-flight (TOF) measuring techniques, e.g. Optical Time-Domain Reflectometry (OTDR) or Light Detection and Ranging (LIDAR), require single photon detectors having high efficiency, high detection rates, low timing jitter and low noise. Superconducting nanowire single-photon detectors (SNSPDs) can achieve excellent performance in all of these applications.

In this context, it is known that the simplest implementation of a SNSPD is based on a superconducting nanowire forming a single meander which is connected to a bias current source and corresponding readout electronics. The detection rate of such a conventional single meander SNSPD is limited due to its recovery time, i.e. the time necessary for the detector to become again sensitive to the detection of a single photon after a photon detection or a false count. It is clear to a person skilled in the art that a short recovery time implies that the detector can detect more photons in a given period of time, given that the detector is disabled for photon detection during its hardware defined recovery time.

It is also known to the person skilled in the art that the recovery time of a single meander SNSPD is directly related to its kinetic inductance which increases monotonically with the length of the nanowire. Thus, reducing the kinetic inductance of a single meander SNSPD lowers its recovery time and allows to increase its detection rate. This is feasible until the so-called latching effect appears, which prevents further reduction of the recovery time. The latching effect is caused by an electro-thermal feedback mechanism which causes the nanowire to enter into and get stuck in a resistive state if its recovery time is too short as compared to the rate at which the nanowire cools down through thermal contact with surrounding materials.

The recovery time of a SNSPD may be further reduced by splitting a single meander nanowire in smaller nanowire sections and connecting each of them in parallel to the bias current source and readout electronics. In fact, if the total nanowire detection area is kept the same, each nanowire section of such a SNSPD having parallelly connected nanowire meander sections is shorter than the nanowire of a corresponding single meander SNSPD and, therefore, each of said nanowire sections has a smaller recovery time. By connecting the sections in parallel, a single readout electronic circuit allows to determine if one of the sections was hit by a photon, i.e. if a section became resistive due to the absorption of a photon. During the recovery time of a given section, each of the other sections is still available for detecting another photon, such that the entire device is still ready for detecting photons. This also allows to decrease the effective recovery time of the entire device as compared to a single meander SNSPD having the same total nanowire detection area.

However, such SNSPDs having nanowire sections connected in parallel show the problem of current cross-talk between the connected sections. In fact, whenever a photon absorption occurs in one of the nanowire sections, the current that was initially traversing this section is partly redistributed, of course, into the readout electronics, which allows creating a detection signal, as well as, automatically and inadvertently, also amongst the other sections. The redistribution of the current arising after photon absorption amongst the other sections may become problematic at high detection rates, in particular if several nanowire sections get hit by a photon quasi simultaneously, i.e. within their respective recovery times, because this may create a current pile-up effect in the other sections. This current pile-up effect can then lead to an increased probability for the other nanowire sections to become resistive on their own, i.e. without having absorbed a photon, if the current in a given section is close to or larger than its own local critical current. This further accentuates the pile-up effect in the remaining nanowire sections and may ultimately create a cascade that leads to a completely disabled detector in a latched state, i.e. in a state wherein all sections are in a resistive state and wherein none can recover to its superconducting state unless the total current is reset electronically to zero and then back to its nominal value, which is a slow operation. Therefore, the potential of parallelly-connected SNSPDs for high detection rates is severely limited by current cross-talk and the corresponding current pile-up and cascading effects.

In general, different solutions are known in prior art to realize SNSPDs allowing to some extent for high detection rates. For example, detectors with multipixel design use several independent SNSPDs integrated on chip next to each other. This solution, instead of connecting several nanowire sections in parallel, uses separate coaxial lines and readout circuits for each of the detector pixels such as to have them work independently of each other. Due to requiring a dedicated coaxial line that must be integrated into the cryostat and a dedicated readout circuit for each nanowire section, this solution is costly and may also be unpractical, e.g. due to the comparatively high volume occupied.

The Russian patent RU 2 327 253 discloses a SNSPD having several nanowire sections connected in parallel as well as, for each of said sections, a resistor connected in series with the corresponding section. The current cross-talk and the corresponding current pile-up and cascading effects mentioned above are partly limited by the addition of said resistors. The recovery time of each nanowire section may also be shortened by increasing the value of the resistors connected in series with said sections, up to a certain limit dictated by said cascading effect which may temporarily disable the entire detector. While this solution allows to separately control the recovery time of each section, it isn't adapted to entirely solve the problem of current cross-talk, in particular at high detection rates, because this device will latch at high count rates.

The Chinese patent application CN 106 289 515 discloses a single meander SNSPD with a self-gain structure. To this end, the SNSPD comprises, next to the single meander nanowire exposed to photons, another nanowire not exposed to photons, both nanowires being connected in parallel. The single meander nanowire is used for detecting photons, whereas the unexposed nanowire is used for amplification of the pulse signals induced by photons hitting the single meander nanowire, such as to increase the amplitude of the output signal. More particularly, the unexposed nanowire is used for providing an internal gain mechanism to a so-called SNAP-SNSPD device, which aims at improving the signal-to-noise ratio of a single meander SNSPD. Despite using an unexposed nanowire next to the single meander nanowire exposed to photons, the device according to CN 106 289 515 therefore still has to be qualified as a single meander SNSPD, the additional structure of which only allows for improving the signal-to-noise ratio and thus amplifying the pulse signals of the single meander of the SNSPD, whilst the device for the remainder suffers from the same drawbacks as other known single meander SNSPDs, in particular as regards the above mentioned problems associated to current cross-talk. In fact, in order to perform said amplification of the pulse signals, the additional structure of the device according to CN 106 289 515 has to be designed such that it cannot support the increase of current caused by a photon detection in the nanowire exposed to photons. This is achieved by choosing the width of the unexposed nanowire such as to be strictly equal to N times the width of the nanowire exposed to photons and having an inductance and resistance value of 1/N times of those of the nanowire exposed to photons. Therefore, the unexposed nanowire of the device according to CN 106 289 515 is specifically designed such that the current density in said unexposed nanowire arising after photon detection in the nanowire exposed to photons will rise above the critical current density it is able to support, thus causing the unexposed nanowire to become resistive and ultimately contribute to increasing the amplitude of the output signal. However, for the same reason, the device according to CN 106 289 515 by principle of construction is not adapted to solve, but rather contributes to the above mentioned problems associated to current cross-talk.

SUMMARY OF THE INVENTION

Therefore, the solutions according to prior art for single photon detection by use of superconducting nanowire single-photon detectors still are affected by several drawbacks. It is the object of the present invention to overcome, at least partly, the above mentioned difficulties and to realize a device for single photon detection having high efficiency, high detection rates, low timing jitter and low noise. The device should be especially adapted for high detection rates by avoiding the disadvantages of prior art devices due to current cross-talk and corresponding current pile-up and cascading effects, whilst keeping at the same time high efficiency. Furthermore, the device should be appropriate for applications in the fields of quantum key distribution, optical free-space communication and time of flight (TOF) measurements, such as Optical Time-Domain Reflectometry (OTDR), light detection and ranging (LiDAR), positron emission tomography (PET) scanners and TOF cameras. Simultaneously, the device is supposed to occupy comparatively low volume and its production shall be possible at sustainable cost, without requiring unnecessary or expensive components.

To this effect, the present invention proposes a device, which is characterized by the features enumerated in claim 1. In particular, the device according to the present invention is characterized by the fact that it further comprises at least one current re-distribution means adapted for at least partly redistributing current arising after absorption of incident photons by any of said superconducting detection means into said current re-distribution means, such as to avoid any of the superconducting detection means not having absorbed an incident photon of suffering or having an increase in current density above its critical current.

These features allow achieving the objectives identified above, in particular by adding supplementary structure embodied by said current re-distribution means to devices of prior art. In fact, by distributing the current arising after cross-talk between the superconducting detection means to said current re-distribution means placed inside the device, it is possible to reduce, respectively to avoid the current cross-talk and the corresponding current pile-up and cascading effects. The device thus may work at higher detection rates as compared to prior art, whilst simultaneously keeping high efficiency of the device.

In particularly preferred embodiments of the present invention, the current re-distribution means are adapted to support enough current to remain superconducting even if all of the superconducting detection means are in their resistive state. Furthermore, the dimensions of the current re-distribution means may be chosen such as to select their respective kinetic inductance. The current re-distribution means may be arranged inside the device such as not to be exposed to incident photons or have a geometry, in particular a width and/or a thickness, preventing them from light detection even when exposed to it. The device according to the present invention further comprises at least one control element each connected in series to a superconducting detection means, respectively to a current re-distribution means, to allow for dividing in controlled manner the bias current into the different parts of the device.

Other features and advantages of the present invention are mentioned in the dependent claims as well as in the description disclosing in the following, with reference to the figures, the invention in more detail.

BRIEF DESCRIPTION OF THE DRAWINGS

The attached figures exemplarily and schematically illustrate some known prior art devices as well as the principles and several embodiments of the present invention.

FIG. 1b schematically illustrates an electronic circuit equivalent to the implementation of a SNSPD of FIG. 1a; FIG. 1c schematically illustrates an electronic circuit equivalent to an implementation of a SNSPD comprising several nanowire sections connected in parallel to a bias current source and corresponding readout electronics; FIG. 1d schematically illustrates an implementation of a single photon detector with multipixel design using several independent SNSPDs; FIG. 1e schematically illustrates an implementation of a SNSPD comprising several nanowire sections connected in parallel to a bias current source and corresponding readout electronics, the SNSPD further comprising, for each of said sections, a resistor connected in series with the corresponding nanowire section; Figure if shows a numerical simulation of the behaviour of the device of FIG. 1e at the time of photon absorption.

FIG. 2b schematically illustrates a second embodiment of a device for single photon detection according to the present invention; FIG. 2c schematically illustrates the structure of a system for single photon detection comprising several devices according to the present invention.

FIG. 3a shows the result of a numerical simulation of the current cross-talk in a device according to the present invention following absorption of an incident photon by one of its photosensitive sections; FIG. 3b shows a comparison of the detection rate in dependence of the number of detected photons per second of a device for single photon detection according to the present invention and of a conventional single meander SNSPD, both covering almost the same optically sensitive area; FIG. 3c shows a comparison of the average detection efficiency per photon in dependence of the number of detected photons per second of a device for single photon detection according to the present invention and of a conventional single meander SNSPD, both covering almost the same optically sensitive area.

DETAILED DESCRIPTION OF THE INVENTION

In the following, the invention shall be described in detail with reference to the above mentioned figures.

The present invention relates to devices for single photon detection based on superconducting material forming superconducting detection means having an absorption area for incident photons. So that the remainder of the description will mainly treat the case where the superconducting detection means are realized by a superconducting nanowire, this doesn't limit the scope of the corresponding explanations that extend by analogy to any type of superconducting detection means adapted for this purpose, for example superconducting strips of any kind of adequate material known to the person skilled in the art and/or superconducting films or coatings of adequate shape and thickness. Therefore as well as for reasons of simplification of the language used, the following description will widely make use indifferently of the terms "superconducting detection means", "superconducting nanowire" and "superconducting nanowire section", again without limiting the scope of corresponding explanations which extend by analogy to any kind of adequate superconducting material.

In this context, in order to better understand the technical problems briefly mentioned in the introduction and underlying the present invention, the following description will shortly recall the structure and operation principles as well as the corresponding difficulties and disadvantages of several kind of prior art devices, in particular with the help of schematic diagrams shown in FIGS. 1a to 1f.

Figure 1A:
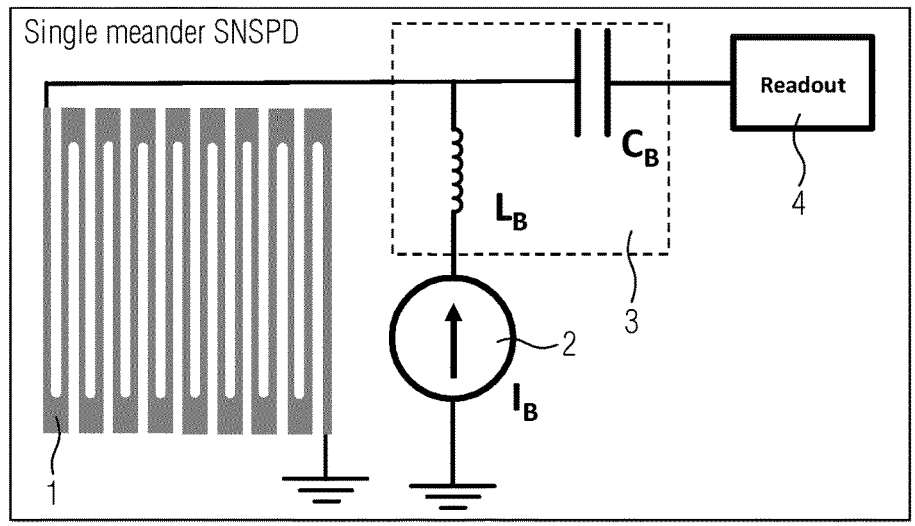
FIGS. 1a to 1f illustrate prior art related to the present invention; in particular, FIG. 1a schematically illustrates the simplest implementation according to prior art of a SNSPD based on a superconducting nanowire forming a single meander which is connected to a bias current source and corresponding readout electronics.
Figure 1B:
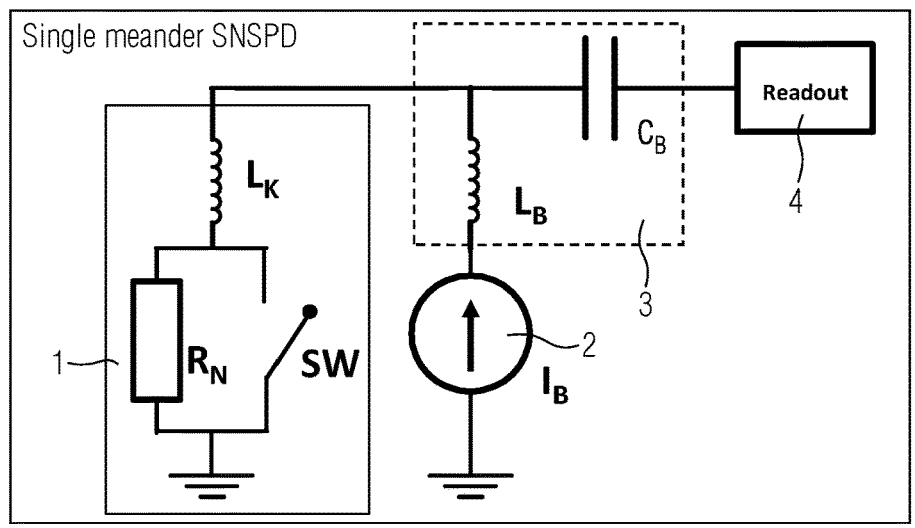

FIG. 1a schematically illustrates the simplest implementation according to prior art of a SNSPD based on a superconducting nanowire. The nanowire 1 forms a single meander which is connected to a bias current source 2 and corresponding readout electronics 4. The bias current source 2 provides a DC bias current $I_B$ which is near and below the critical current $I_C$ of the superconducting nanowire 1 and which is flowing through the single meander superconducting nanowire 1 by the intermediate of a bias tee 3. The latter may be embodied, such as shown by way of example in FIG. 1a, as an inductor having an inductance $L_B$ and a capacitor having a capacitance $C_B$, but it could also consist in any other equivalent diplexer or filter element 3 allowing to realize a bias tee in order to combine or separate DC and AC components of an electrical signal. The single meander nanowire 1 forms a detection area which is exposed to incident light, i.e. to incident photons, and is cooled below its critical temperature $T_C$, such that the current flowing through the single meander nanowire 1 normally remains below its critical current $I_C$. In case of absorption of an incident photon by the superconducting nanowire 1, the latter transitions from its non-resistive superconducting state to a resistive state due to appearance of a local resistive hotspot which creates a diminution of the effective width of the superconducting nanowire and thus leads to an increase in current density within the remaining width of the superconducting nanowire 1 above the critical current $I_C$. The readout electronics 4 is usually composed of an amplifier and a comparator capable of sensing a change in voltage after the amplifier, such that the transition of the single meander superconducting nanowire 1 from its non-resistive superconducting state to a resistive state induced by photon absorption will lead to generating an output voltage pulse, thus allowing single photon detection. Such configuration may be illustrated in simplified and schematic manner, by an electronic circuitry equivalent to the single meander SNSPD of FIG. 1a, such as shown in FIG. 1b. Therein, the single meander nanowire forming a detector 1 is represented by an entity having a kinetic inductance $L_K$, a resistor $R_N$ providing a normal resistive state and a switch SW controlled by photon absorption. The operating principle of the single meander SNSPD set out above may be simplified for the schematic diagram of FIG. 1b as follows. When the detector 1 is in its superconducting state, the switch SW is closed and the bias current $I_B$ provided by the bias current source 2 is flowing through the detector 1. When a photon absorption occurs, the switch SW opens, i.e. the detector 1 enters into its resistive state, with the probability for this to happen depending on the value of the bias current $I_B$ and of the temperature of the detector 1, and a current starts flowing through the resistor $R_N$. This dissipates heat through Joule heating and reinforces the detector's resistive state which keeps the switch SW opened. Because the resistor $R_N$, typically having a resistance of about 1 kOhm, is normally much larger than the impedance of the readout circuitry, typically having a resistance of about 50 Ohm, the current flowing after a photon absorption is transiently redirected towards the readout circuitry 4. This implies that heat is no longer dissipated through $R_N$, allowing the detector 1 to cool again below its critical temperature $T_C$, which equals with closing the switch SW and to draw the bias current $I_B$ back into the detector 1, such that the latter is ready again for photon detection. However, like mentioned in the introduction, the detection rate of such a conventional single meander SNSPD is quite limited due to its recovery time, in particular with increasing detection area, i.e. with increasing length of the superconducting nanowire 1, because the recovery time is directly related to the kinetic inductance $L_K$ of the single meander which increases monotonically with the length of the nanowire.

Figure 1C:
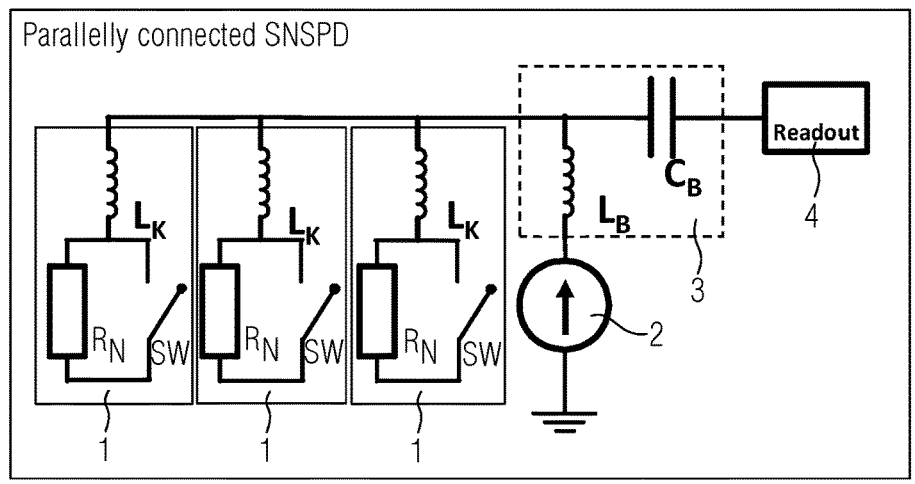

FIG. 1c schematically illustrates, in simplified manner similar to FIG. 1b, an electronic circuit equivalent to an implementation of a SNSPD comprising several nanowire sections 1 connected in parallel to a bias current source 2 and corresponding readout electronics 4 by the intermediate of a bias tee, respectively of a filter element 3. Each nanowire section 1 has a kinetic inductance $L_K$ and a resistor $R_N$, which each typically have the same or similar value, and the bias current $I_B$ normally is divided equally into each nanowire section 1, i.e. for the example of a SNSPD comprising three nanowire sections 1 shown in FIG. 1c that each section 1 is biased with a bias current $\sim 0.33 * I_B$. The operating principle of this SNSPD with several nanowire sections 1 connected in parallel generally corresponds to what has been set out above for a single meander SNSPD, with the difference that, when photon absorption occurs in one of the nanowire sections 1, the current arising after photon absorption is not only redirected for signal pulse generation towards the readout electronics 4 which thus allows photon detection, but automatically will also enter into the other nanowire sections 1, wherein the local current thus is temporarily increased beyond the bias current $I_B$ due to this current cross-talk between part of or all of the nanowire sections 1. For as long as the increased current in any nanowire section 1 concerned by current cross-talk remains below the local critical current $I_C$, the principle of using several parallelly connected nanowire sections 1 to increase the detection rate works. However, this current cross-talk and the corresponding current pile-up and cascading effects mentioned in the introduction may lead to a partly or completely disabled detector, i.e. to a state wherein part of or all of the nanowire sections 1 are in a resistive state such that most of or the entire detector is in a latched state. This may happen in particular at high detection rates where several nanowire sections 1 might contribute to generating current cross-talk as being simultaneously hit by a photon.

Figure 1D:
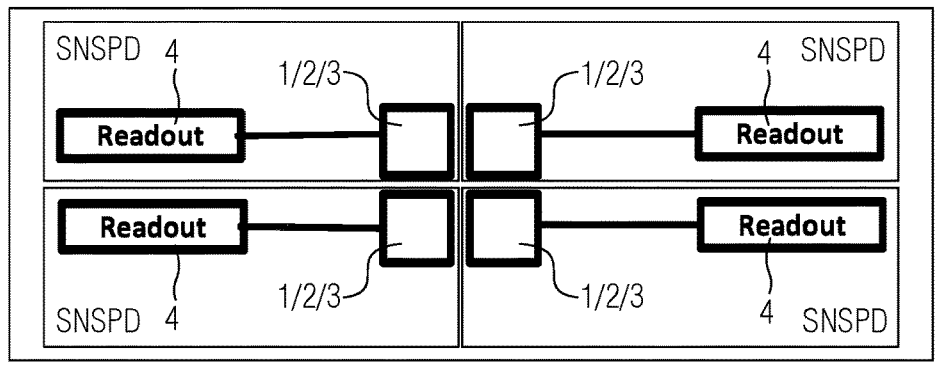

FIG. 1d schematically illustrates an implementation of a single photon detector with multipixel design. In this case, several independent superconducting nanowire sections 1 are connected by separate coaxial lines to corresponding readout circuits 4, i.e. the connection of the nanowire sections isn't parallel, such that each nanowire section 1 is incorporated into an independent SNSPD. Like mentioned in the introduction, this solution is costly, occupies a comparatively high volume and, in general, represents a different approach as compared to SNSPDs comprising several nanowire sections connected in parallel.

Figure 1E:
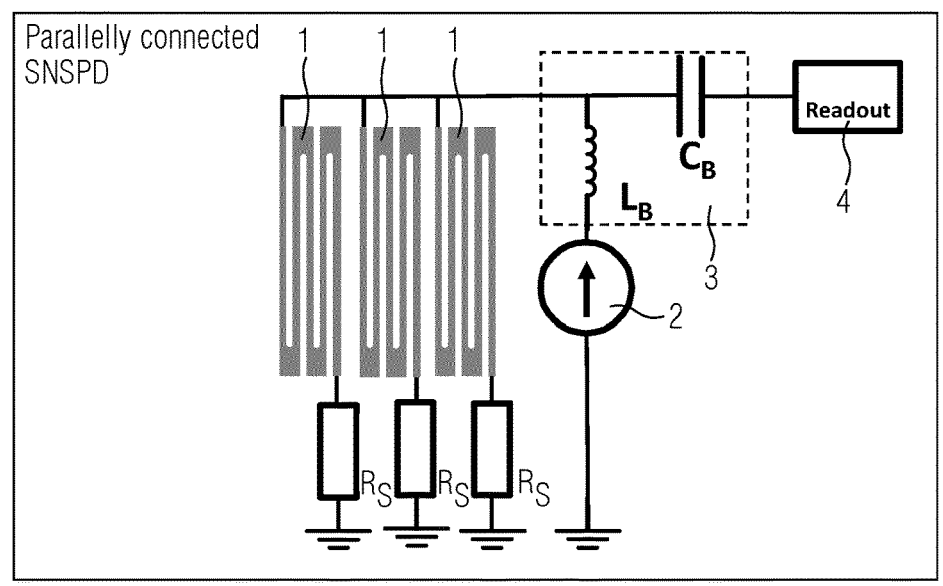
Figure 1F:
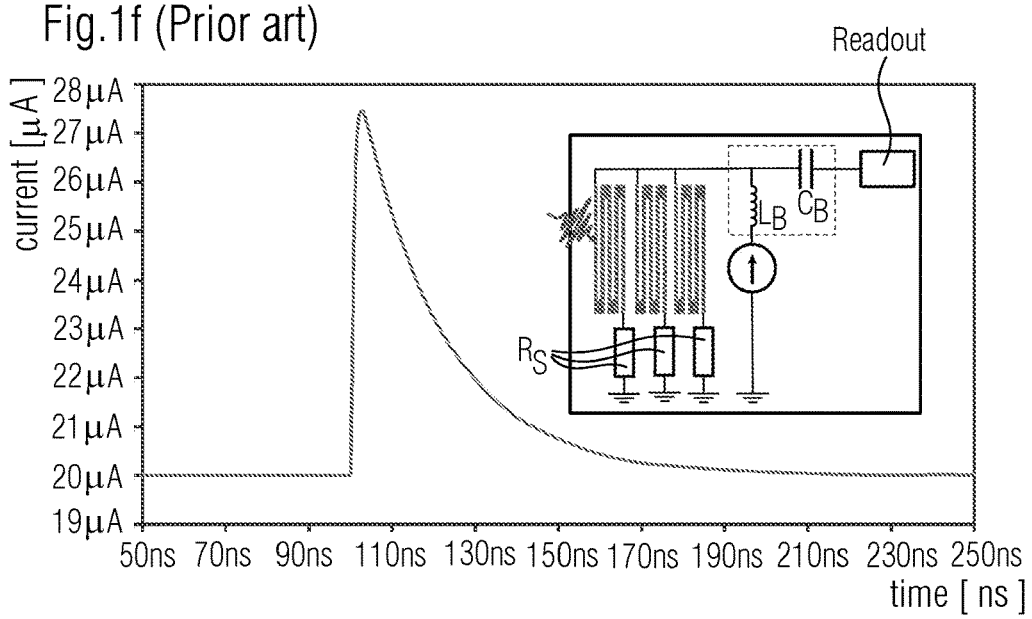

FIG. 1e schematically illustrates an implementation of a SNSPD according to Russian patent RU 2 327 253, this SNSPD comprising several nanowire sections 1 connected in parallel to a bias current source 2 and corresponding readout electronics 4 by the intermediate of a bias tee, respectively of a filter element 3. This SNSPD further comprises, for each of said sections, a resistor $R_S$ connected in series with the corresponding nanowire section 1. Though adding said resistors $R_S$ allows to control to some extent the recovery time of each section as well as to partly limit the current cross-talk and the corresponding current pile-up and cascading effects mentioned above, this measure isn't adapted to entirely solve the problem of current cross-talk at high detection rates, because the cross-talk is reduced by an increased resistance of the resistor $R_S$. This resistance is limited to a maximum value above which the device will latch. To understand the reasons for the latter, Figure 1f shows a numerical simulation of the behaviour, induced by current cross-talk, of the device of FIG. 1e at the time of absorption of a photon by one of the nanowire sections 1. The flash in the inset figure at the right upper corner of FIG. 1f symbolizes that a photon hits the leftmost nanowire section 1. The current arising after this photon absorption in one of the other sections, which are not hit by a photon, is shown on the main graph of FIG. 1f. Before the photon absorption, the current in the non-hit section is stable at a bias current of about 20 µA. At the time when the leftmost section is hit by a photon, in FIG. 1f at time 100 ns, the current in the non-hit section rises up to slightly more than 27 µA and then slowly recovers to the value of the bias current due to the time dynamics of the electronic circuit. However, the superconducting nanowire sections 1 should be operated as close as possible to and below its critical current $I_C$ in order to maximize its detection efficiency. Hence, if the critical current $I_C$ is larger than 20 µA but smaller than 27 µA, the situation illustrated in Figure 1f would lead to a state where all nanowire sections 1 are in a resistive state, such that the entire device would latch and thus be disabled. Therefore, it isn't possible to operate this device close to its maximum detection efficiency, but it is necessary to decrease the bias current which in turn lowers the efficiency. Furthermore, it is likely that, at high detection rates, the latching state of the device happens nevertheless, such that the device is not adapted for photon detection at high count rates.

By turning now to the device for single photon detection according to the present invention, it is to be noted that the latter proposes an anti-cascading design for parallelly-connected SNSPDs. An anti-cascading parallelly-connected SNSPD according to the present invention, henceforth called ACPC-SNSPD, is primarily designed to solve the above mentioned problem of current cross-talk as well as of the corresponding current pile-up and cascading effects at high count rates, such as to unleash the potential of parallelly-connected SNSPDs for high detection rates.

Figure 2A:
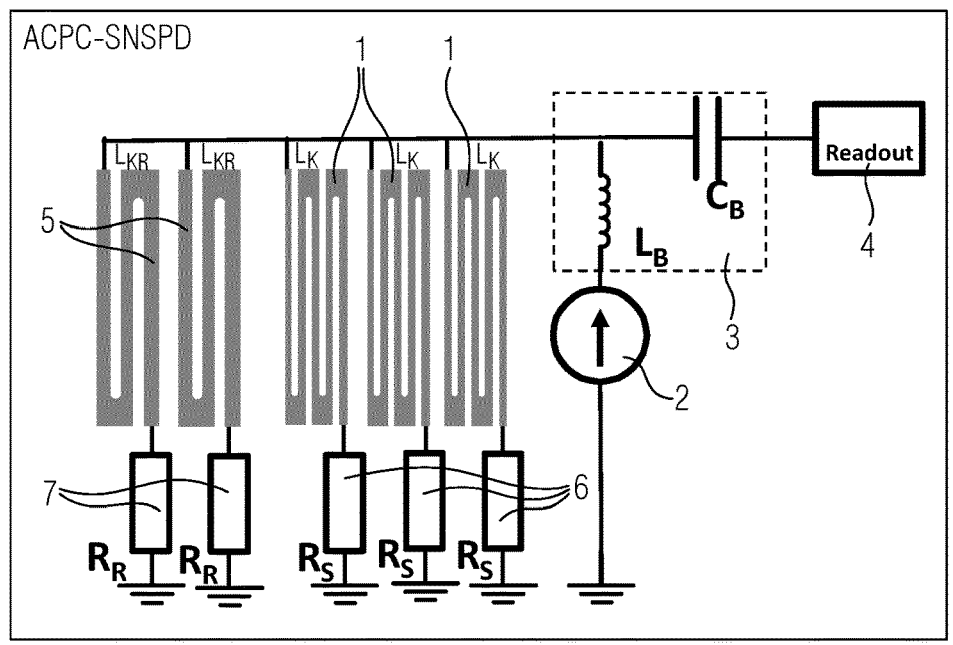
FIGS. 2a to 2c illustrate the structure of a device and of a system for single photon detection according to the present invention; in particular, FIG. 2a schematically illustrates a first embodiment of a device for single photon detection according to the present invention.

In general, the device for single photon detection according to the present invention comprises at least two, typically several, superconducting detectors or "detection means" 1 as well as a bias current source 2, a filter element 3 and a readout circuit 4, such as schematically illustrated in FIG. 2a. Preferably, the superconducting detection means 1 are each realized by a superconducting nanowire section which generally has a geometric shape of a meander and which as such is well known to the person skilled in the art. Each superconducting detection means 1, i.e. each meandered superconducting nanowire section 1, is exposed to light, forms a detection area adapted for absorption of incident photons and is connected in parallel to said bias current source 2 as well as to said readout circuit 4 by the intermediate of said filter element 3. Each superconducting detection means 1 is maintained at a temperature below its critical temperature $T_C$. Said bias current source 2 provides each superconducting detection means 1 with an electrical bias current $I_B$ situated close to and below a critical current $I_C$ of the superconducting detection means 1, such as to normally maintain each superconducting detection means 1 in a non-resistive superconducting state. Moreover, each superconducting detection means 1 is adapted to transition, in case of absorption of an incident photon, from said non-resistive superconducting state to a resistive state. In fact, absorption of an incident photon creates a perturbed region in the superconducting detection means 1. The perturbed region, which is traversed by the bias current $I_B$ like the rest of the superconducting detection means 1, leads to appearance of a local resistive hotspot which creates a diminution of the effective volume of the superconducting detection means 1 and thus leads to an increase in current density within the remaining superconducting volume of the superconducting detection means 1 above the critical current $I_C$. In turn, the readout circuit 4 is adapted to sense a voltage change corresponding to said transition of the superconducting detection means 1 into its resistive state and thus allows to create an event signal for each absorption of an incident photon by any of said superconducting detection means 1.

Although the superconducting detection means 1 are preferably each realized by a meandered superconducting nanowire section, these detection means might also be formed by superconducting strips of any kind of adequate material and/or by superconducting films or coatings of adequate shape and thickness, which is generally known to the person skilled in the art and thus won't be described here in more detail. Furthermore, each superconducting detection means 1 may have any adequate geometric shape, for example may be meandered, circular, of straight line form, of interleaved geometry, a combination of these geometries or of any other shape adequate for a specific application. In any case, the at least two superconducting detection means 1, i.e. for many applications all meandered superconducting nanowire sections 1, are preferably produced simultaneously and in one piece, by use of known manufacturing methods. The bias source 2 providing each superconducting detection means 1 with said bias current $I_B$ may be chosen by the person skilled in the art amongst all known components adapted for that purpose and thus won't be described here in more detail, either. The filter element 3 as such is known as well and may be realized, such as shown by way of example in FIG. 2a, as bias tee 3 comprising an inductor with inductance $L_B$ and a capacitor with capacitance $C_B$, but it could also consist in a diplexer or in any other equivalent means allowing to realize a filter in order to combine or separate DC and AC components of an electrical signal. The readout circuit 4 typically comprises an amplifier and a comparator capable of sensing a change in voltage after the amplifier, but could also consist of any other equivalent readout means known to the person skilled in the art, given that the invention isn't situated inside these components of the device.

In fact, a device for single photon detection according to the present invention differs from prior art primarily in two ways. Firstly, in order to decrease the electrical cross-talk between the superconducting detection means 1 connected in parallel, i.e. between the meandered superconducting nanowire sections 1, at least one additional section 5 also connected in parallel is integrated into the device, such as schematically illustrated in FIG. 2a. These additional parallel sections 5 are engineered in a way that they cannot become resistive even when light is incident on the device, i.e. these sections preferably aren't exposed to incident light and/or have a geometry, in particular because of its width and/or thickness, preventing them from light detection even when exposed to it, such that these additional sections 5 aren't adapted for photon detection. In the following, the superconducting detection means 1 adapted for detecting photons when light is incident on the device, i.e. in general said meandered superconducting nanowire sections 1, are also named "photosensitive sections" and said additional parallel sections 5 that are unexposed to light and/or have a geometry such that they cannot detect photons, even when light is incident on the device, are named "current re-distribution sections", "current re-distribution paths", current re-distribution portion, current redistributor or "current re-distribution means" 5. It shall also be noted that the term "integrated" is used here with the signification that the current re-distribution means 5 are preferably produced in one piece as well as simultaneously with the photosensitive sections, i.e. normally using the same nanofabrication technique used to produce all meandered superconducting nanowire sections 1. Typically, the same nano-fabrication technique is used to produce in one piece a chip comprising all components of the entire ACPC-SNSPD. Adding additional sections like said current re-distribution means 5 is adapted to solve the problems linked to current cross-talk as well as to the corresponding current pile-up and cascading effects, because the current cross-talk between a photosensitive section having become disabled and any other section, i.e. the amount of current increase in a given section, decreases with the total number of sections. The latter is valid to some extent for the two cases that the total number of sections is composed only of photosensitive sections, like in prior art devices, as well as that the total number of sections is composed both of photosensitive sections serving for photon detection and of additional sections only serving as current re-distribution means, like in a device for single photon detection according to the present invention. However, the latter configuration according to the present invention is particularly advantageous, especially at high detection rates, given that the current re-distribution means 5 do not contribute to creating or increasing the current cross-talk, but only resorb the current resulting from cross-talk originating at the photosensitive sections 1. Due to this design, only a limited number of sections, namely the photosensitive sections 1, may simultaneously become resistive by absorption of the incoming light, whilst said current re-distribution paths 5, by way of construction of the device, cannot become resistive by absorption of the incident light. Secondly, the additional sections, i.e. said current re-distribution paths 5, are designed to support enough current to remain superconducting, i.e. to remain available to carry current in their superconducting state, even if all of the photosensitive sections 1 of the device are in their resistive state after multiple simultaneous photon absorption. This is done by choosing the superconducting material, the number, the geometry, the width and/or the thickness of the current re-distribution paths 5 in such a way that even if the total bias current is flowing into them, which can happen if all the photosensitive sections 1 are in a non-superconducting state, the current density in each re-distribution path 5 is nevertheless lower than the critical current density of the superconducting material used. For this purpose, the superconducting material used for the current re-distribution paths 5 may for example be different from the superconducting material used for the photosensitive nanowires. For the same purpose, for a given number $N_S$ of photosensitive nanowires 1 of width $W_S$ and of thickness $d_S$ made of a given superconducting material and a number $N_R$ of re-distribution paths 5 which are all terminated with the same resistance value $R_R$ (supposed for this example to be equal to $R_S$) and (also supposed for this example to be) produced from the same superconducting material, the minimum width $W_R$ required for the current re-distribution paths 5 can be calculated by the formula $W_R > W_S*[1+(N_S/N_R)]$. It is to be noted that $W_R$ has to be superior to this value which forms a lower bound for said minimum width $W_R$ of the current re-distribution paths 5. In particular, the lower bound on the value of $W_R$ is based on the assumption that the critical current density is proportional to the cross-section $d*W_R$ of the re-distribution paths 5, but in practice there may be reasons, like limitations of the superconducting material or constraints due to the nanofabrication method, that would make the requirements on the re-distribution paths deduced from this assumption insufficient, though still being necessary. For these reasons, the minimum width $W_R$ required for the current re-distribution paths 5 is generally fixed at a larger value than the minimum width required according to the above mentioned formula. It is also to be stressed that this only is mentioned as specific example, but that the above mentioned formula does not represent the most general expression for the lower bound for said minimum width $W_R$, given that this formula applies in principle only if the materials and the thicknesses of the photosensitive nanowires 1 and of the current re-distribution paths 5 are the same and if the resistances $R_S$ and $R_R$ are the same as well. A more general expression, applying if the thicknesses $d_S$ and $d_R$ of the photosensitive nanowires 1 and of the current re-distribution paths 5, respectively, differ, and if the resistances $R_S$ and $R_R$ are not necessarily the same, is the formula $W_R > W_S * (d_S/d_R)*[(R_S/R_R)+(N_S/N_R)]$. It is possible to also indicate an even more general expression for the lower bound of said minimum width $W_R$ for the case that the materials of the photosensitive nanowires 1 and of the current re-distribution paths 5 differ, too. For reasons of simplicity, this isn't further detailed here, but may be obtained by the person skilled in the art in view of the present disclosure and its technical teaching. In this context, it is to be noted that the device according to the Chinese patent application CN 106 289 515 has an unexposed nanowire with a width limited to values inferior to the above mentioned lower bound on the value of $W_R$, in order to allow for amplification of the pulse signal and such as explained in the introduction, such that this unexposed nanowire cannot serve as current re-distribution path such as proposed by the present invention. To the contrary, the design of a device according to the present invention allows that the current pile-up effect does not lead to a cascade that temporarily disables all photosensitive sections 1 and requires time consuming reset of the device. This provides for freedom of designing the additional sections serving as current re-distribution paths 5 such as to allow optimal performance of the entire device.

As specific example, FIG. 2a shows a schematic view of a first embodiment of a device for single photon detection according to the present invention, wherein the device comprises three parallelly connected photosensitive sections 1 forming the detection area, akin to the three nanowire sections of the prior art devices illustrated in FIGS. 1c and 1e, as well as two parallelly connected current redistribution paths 5 which are absent in prior art SNSPDs using parallelly connected nanowire sections and which are unexposed to incident light. These current redistribution paths 5 allow to limit any current cross-talk arising between the three photosensitive sections 1 at the time when photon absorption happens in one or several of these photosensitive sections 1. Thus, this allows to avoid the corresponding current pile-up and cascading effects observed in prior art devices. Moreover, this is also influenced by choosing the shape of the current re-distribution paths 5 such as to select their respective kinetic inductance $L_{KR}$, preferably in a manner depending on the kinetic inductance $L_K$ of the photosensitive sections 1 in order to allow for optimal cooperation with the latter. Furthermore, like illustrated in FIG. 2a, the device for single photon detection according to the first embodiment of the present invention preferably, but not necessarily, also comprises control elements 6, 7, typically realized as resistors $R_S$ and $R_R$, which are connected in series to the photosensitive sections 1, respectively to the current re-distribution paths 5, to divide in predefined, controlled manner DC bias current into the different parts of the device. The values of $R_S$ and $R_R$ are also chosen in a manner allowing to select the current that flows into the photosensitive sections 1 and in the current re-distribution paths 5.

In another embodiment of the present invention, not illustrated in the figures but similar to the device of FIG. 2a, the current redistribution paths 5 are exposed to light brought by an optical fibre, but nevertheless don't detect light even when exposed to it, for example because of the geometry of the nanowire forming the current redistribution paths 5, namely because of its width and/or thickness. More precisely, the geometry of the nanowire of each current re-distribution path 5 can be chosen such as to obtain any desired kinetic inductance $L_{KR}$ while choosing the width and/or thickness to be large enough to prevent light detection even when a single photon is absorbed by the nanowire forming the current redistribution path.

In still another embodiment of the present invention, not illustrated in the figures but similar to the device of FIG. 2a, the light is directed towards the device by free-space coupling, using lenses, in a manner allowing that the incident light either is directed towards the photosensitive sections 1 only or is directed to the current redistribution paths 5 as well, the latter in this case, however, being unable to detect light due to their geometry which can be chosen such as mentioned above.

Figure 2B:
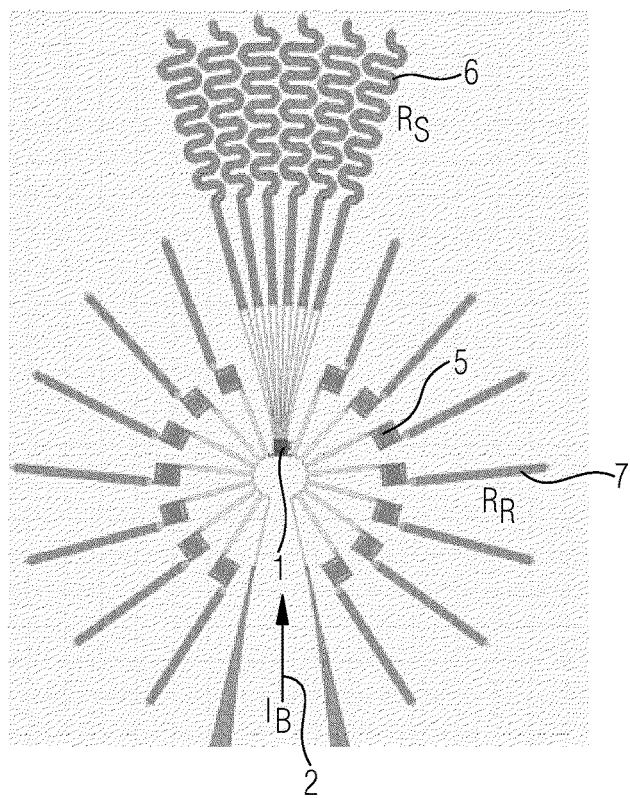

FIG. 2b schematically illustrates a second embodiment of a device according to the present invention, wherein the photosensitive sections 1 connected in parallel inside the device are positioned sensibly at the centre of the device. Each photosensitive section 1 is preferably terminated by a control element 6 which is connected in series to the corresponding photosensitive section 1 and is realized by a resistor $R_S$ shown as wavy lines at the top of FIG. 2b. The current redistribution paths 5, connected in parallel to the photosensitive sections 1, are formed by meandered superconducting nanowires and may be arranged such as to form two arcs of a circle opposed to each other, with the photosensitive sections 1 being situated at close to the centre and between said two arcs, such as shown by way of example in FIG. 2b. The device preferably further comprises control elements 7 which each are connected in series to a current redistribution path 5, said control elements 7 being realized by resistors $R_R$ shown in FIG. 2b as straight lines outside said two arcs of a circle. Like in all other embodiments of a device according to the present invention, the end of the photosensitive section 1 as well as of the current redistribution paths 5 not serving for parallel connection inside the device, respectively the control elements 6, 7 connected to these ends, if present, are connected to ground, like the bias current source 2 as well. The latter isn't shown in its entirety in FIG. 2b, which only symbolically indicates at its bottom centre part that the bias current $I_B$ flows into the device through connection lines also situated between said two arcs and then is divided into the photosensitive sections 1 and the current redistribution paths 5. In this embodiment, the photosensitive sections 1 preferably are exposed to incident light brought inside the device by an optical fibre having a core diameter similar to or smaller than the detection area formed by all photosensitive sections 1 together.

In general, like already stated above, the superconducting material, the number, the geometry, the width and/or the thickness of the current re-distribution paths 5 of a device according to the present invention are chosen in such a way that the current density in each re-distribution path 5 is always lower than the critical current density of the superconducting material used for the corresponding re-distribution path 5, even if the total bias current is flowing thereinto, which may happen if all the photosensitive sections 1 are in a non-superconducting state. However, due to the large number of potential applications of a device according to the present invention and the large variety of parameters of the device which are adapted to be modified in order to meet the corresponding constraints, it is difficult to indicate a strict mathematical rule for the choice of the number and dimensions of the different components of the device, in particular of the photosensitive sections 1 and of the current re-distribution paths 5, but working values can be found in certain ranges such as will be explained below. In fact, the number $N_S$ of photosensitive sections 1 is a trade-off between the detection rate to be reached, requiring a large number of photosensitive sections 1, and the desired output signal amplitude, which decreases with an increasing number $N_S$ of photosensitive sections 1. A decreasing signal amplitude also increases the timing jitter of SNSPDs, which constitutes another trade-off to be considered in choosing the number $N_S$ of photosensitive sections 1. Typical values for the number $N_S$ of photosensitive sections 1 are preferably situated in the range of 2 to 100, and more preferably between 4 to 40, and even more preferably between 6 to 15.

The number $N_R$ of re-distribution paths 5 preferably is chosen such that the ratio $N_S/(N_R+N_S)$ is situated in the range between 5% to 50%, and more preferably between 10% and 25%. The re-distribution paths 5 can also be at least partly grouped so that an initially anticipated number $N_R$ of re-distribution paths 5 with given inductances $L_K$ and resistances $R_R$ of the corresponding control elements 7 can be replaced by a single equivalent re-distribution path 5 or a reduced (or also an increased) number $N_{RE}$ of equivalent re-distribution paths 5, with properly chosen inductance $L_{KRE}$ and resistance $R_{RE}$ of the corresponding control element(s) 7 to obtain the same physical behaviour for the entire device. For example, a single equivalent re-distribution path 5, i.e. $N_{RE}=1$, can act the same way as an initially anticipated number $N_R$ of re-distribution paths 5 in parallel (with $N_R>1$ here), provided that the geometry of the single re-distribution path 5 is chosen such that its inductance $L_{KRE}$ is equal to $L_{KR}$ ($N_R/N_{RE}$) and the resistance $R_{RE}$ of its corresponding control element 7 is equal to $R_R/(N_R/N_{RE})$. The geometry, i.e. primarily the width and thickness, of the equivalent re-distribution paths 5 must also be adapted to support enough current to remain superconducting even if all of the photosensitive sections 1 are in their resistive state. This can be achieved by choosing the width of the equivalent redistribution path $W_{RE}$ to be equal or greater than $W_R*N_R/N_{RE}$. In this case, $L_{KRE}$ could also be chosen to have slightly larger values (preferably up to twice) or smaller values (preferably down to half), if this allows to improve the AC behaviour of the equivalent re-distribution path 5 and if it does not impair the proper functioning of the device. The value of the number $N_{RE}$ of equivalent re-distribution paths 5 can be chosen between 1 and $N_R$. In practice, choosing $N_{RE}=1$, i.e. that a single equivalent re-distribution path 5 replaces an initially anticipated number $N_R$ of re-distribution paths, could however lead to nanofabrication difficulties, because the resistance $R_{RE}$ of the control element could be too small to be fabricated with sufficiently high precision. Therefore, in practice, the value of the number $N_{RE}$ of equivalent re-distribution paths 5 is preferably chosen such as to be situated in the range between 2 and $N_R$, more preferably between 4 to $N_R/2$, and even more preferably between 8 to $N_R/4$.

In a preferred embodiment, the control elements 7 of the re-distribution paths 5 and their resistances and/or inductances ($R_R$ and $L_{KR}$) have the same values as the ones ($R_S$ and $L_K$) of the control elements 6 of the photosensitive sections 1. This guarantees that the current is equally split over the different components of the device. The value of the kinetic inductance $L_{KR}$ of the re-distribution paths 5 is preferably chosen to be equal to the kinetic inductance $L_K$ of the photosensitive sections 1, but could be different as well in order to change the AC behaviour of the re-distribution paths 5. The resistance $R_S$ of the control elements 6 is preferably chosen to have a value as high as possible, because a high value shortens the recovery time of a photosensitive section, but it also has to be kept under a maximum limit, preferably between 2 to 500 Ohms, and more preferably between 5 to 150 Ohms, and even more preferably between 10 to 100 Ohm, depending on the material used and on the value of the kinetic inductance $L_K$, because otherwise the device can show a latching behaviour. The kinetic inductance $L_K$ of the photosensitive sections 1 is also determined by the superconducting material and the geometry of the nanowire, i.e. the length, width and thickness of each photosensitive section 1. Typically, the kinetic inductance $L_K$ of the photosensitive sections 1 has to be minimized to improve the recovery time of each individual section. Values for $L_K$ and $L_{KR}$ are preferably situated in the range of 20 to 10000 nH, and more preferably 50 to 1000 nH, and even more preferably 100 to 500 nH.

Figure 2C:
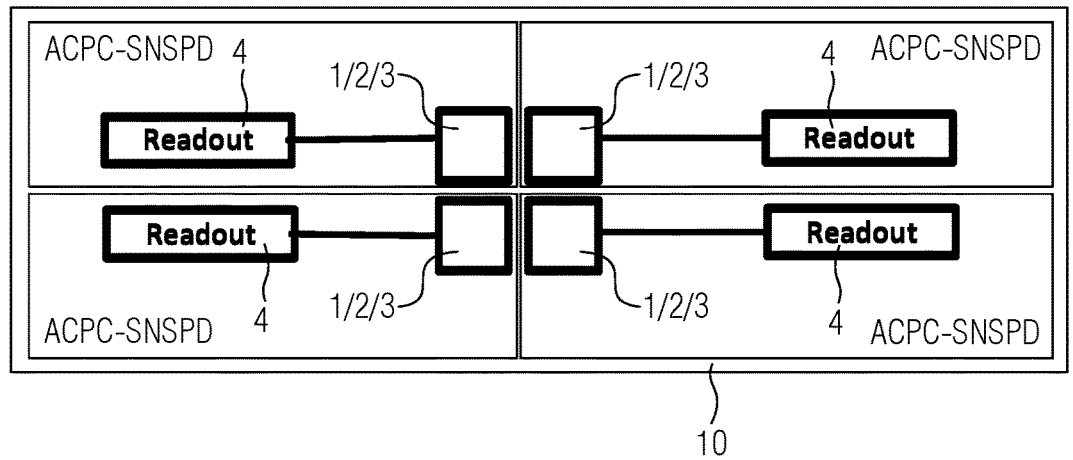

The device according to the present invention, i.e. in most practical applications an ACPC-SNSPD using meandered superconducting nanowires, may, if so desired or required, also be integrated into a more complex system. For example, it is possible to realize a large multi-pixel array single photon detection system 10 comprising a plurality of independent ACPC-SNSPDs with a dedicated coaxial line and readout for each pixel, i.e. for each ACPC-SNSPD, such as schematically illustrated by way of example in FIG. 2c. Though the photosensitive sections 1 as well as the current redistribution paths 5 are connected in parallel inside of each of the ACPC-SNSPDs integrated into the multi-pixel array single photon detection system 10, the ACPC-SNSPDs are integrated into the system 10 such as to each have a separate readout 4. Therefore, this configuration may be considered to have wide analogy to the prior device shown if FIG. 1d. Of course, the number of the ACPC-SNSPDs integrated into such a multi-pixel array single photon detection system 10 may vary, the ACPC-SNSPDs integrated may have the same of different detection area, components, and layout, etc., all of these parameters being chosen depending on the specific application of the multi-pixel array single photon detection system 10. The latter may be realized by a chip or any type of integrated circuit and may also be used as a part of another, larger single photon detection structure.

In general, the number and dimensions of the different parts of the device or system according to the present invention have to be carefully optimized, i.e. of the photosensitive sections 1, of the current redistribution paths 5, of its kinetic inductance $L_K$ and $L_{KR}$ respectively, of the capacitances of the control elements 6, 7, i.e. the resistors $R_S$ and $R_R$, if present, and the length, thickness as well as width of the nanowires if the photosensitive sections 1 are realized in this manner or, in general, the geometric shape of the superconducting detection means 1. As general rule, the cross-talk is minimized by increasing the number of current re-distribution means 5, by small values of the kinetic inductances $L_K$ and $L_{KR}$ and by large resistances of the resistors $R_S$ and $R_R$. It is clear to a person skilled in the art how to apply this rule to a specific layout and application, without it being possible to describe herein all possible configurations covered by the present invention. However, applying this general rule might also lead to decreasing the amplitude of the output signal, which might reduce the jitter of the detector, and small values of the kinetic inductances $L_K$ and $L_{KR}$ as well as large capacitances of the resistors $R_S$ and $R_R$ might also lead to increasing the speed of the device in terms of lowering its recovery time, which under certain circumstances might again lead to latching of the entire device. For these reasons, careful optimization of the number and dimensions of the different parts of the device are required for each specific layout and application. For these reasons, the precise control of the dimensions of the different parts of the device according to the present invention is of importance and the current re-distribution paths 5 are preferably integrated into the device by using the nanofabrication process used to produce the photosensitive sections 1 of the device, like already mentioned above. Though this isn't mandatory, not integrating these components by use of the same nanofabrication process might impair the proper implementation of the present invention due to the presence of parasitic capacitances, resistances and inductances and to the difficulty of properly controlling the values of the inductances $L_{KR}$ of the current re-distribution paths 5 and of the capacitances of the resistors $R_R$.

Figure 3A:
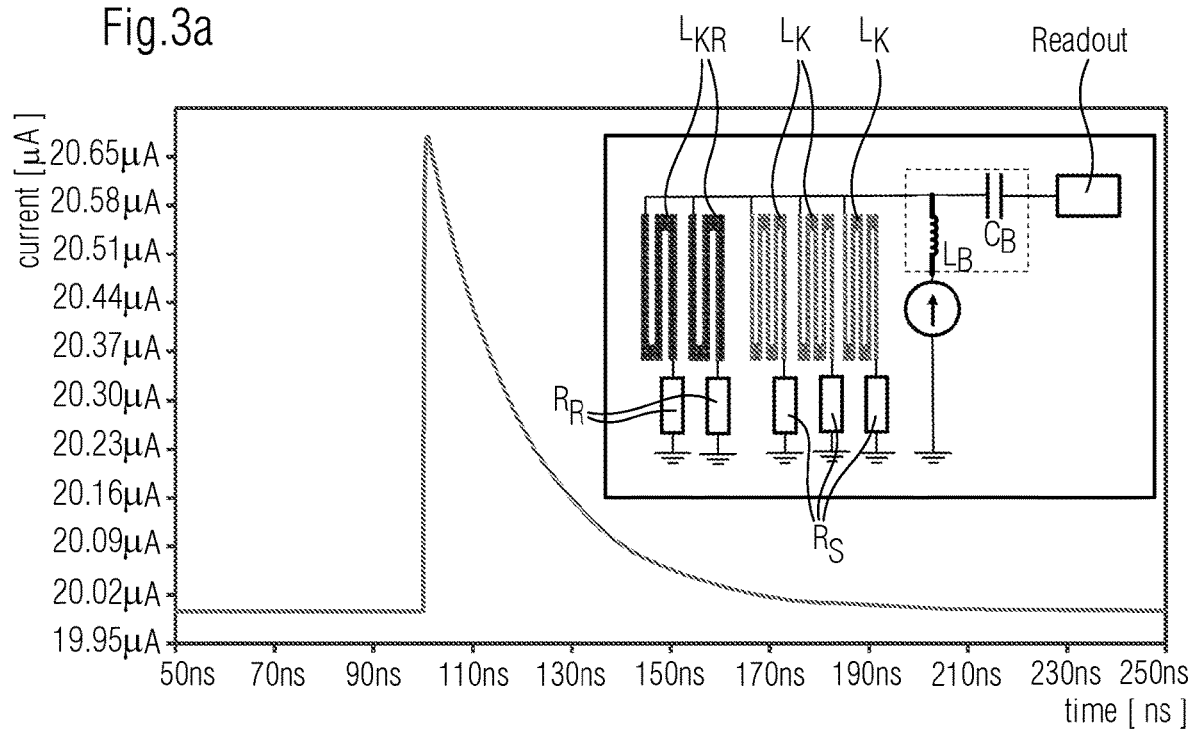
FIGS. 3a to 3c illustrate the advantages of a device for single photon detection according to the present invention, partly as compared to prior art devices; in particular.

The advantages of an ACPC-SNSPD, respectively of a multi-pixel array single photon detection system 10, according to the present invention are illustrated in FIG. 3a by means of a numerical simulation which shows how the current cross-talk between the photosensitive sections 1 of a device according to the present invention following absorption of an incident photon by one of its photosensitive sections is mitigated. The flash in the inset figure at the right upper corner of FIG. 3a symbolizes that a photon hits the leftmost photosensitive section 1. The current arising after this photon absorption in one of the other photosensitive sections 1, which aren't hit by a photon, is shown on the main graph of FIG. 3a. Before the photon absorption, the current in the non-hit section is stable at a bias current of about 20 µA. At the time when the leftmost photosensitive section 1 is hit by a photon, in FIG. 3a at time 100 ns, the current in the non-hit section rises only minimally to about 20.65 µA, due to the mitigation of the current arising because of cross-talk by the current re-distribution means 5, and then slowly recovers to the value of the bias current due to the time dynamics of the electronic circuit. As compared to the situation in prior art devices such as discussed by way of example in the context of FIG. 1f, the current cross-talk inside a device, respectively inside a system 10, according to the present invention thus is much smaller. This allows to operate the photosensitive sections 1 of such device, respectively of such system 10, close to their critical current $I_C$, hence at the maximum efficiency. Furthermore, because of the mitigation of the current cross-talk by the current re-distribution means 5, the device, respectively the system 10, does not become disabled even at high photon detection rates.

Figure 3B:
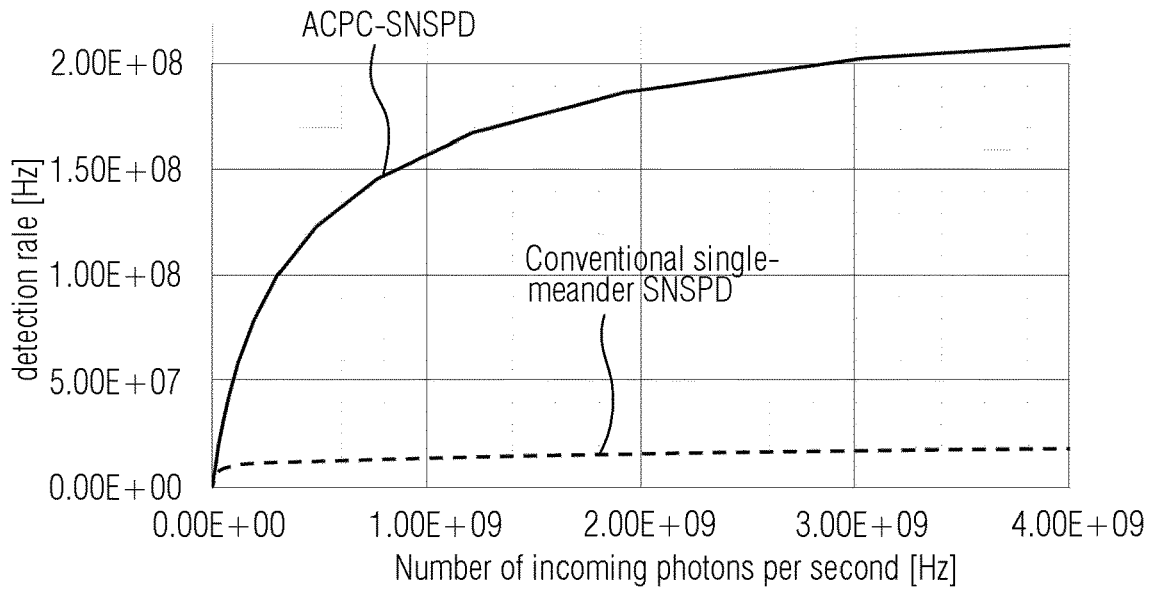

In FIG. 3b, the measured detection rate in dependence of the number of incident photons is compared for two devices, one based on the conventional single meander SNSPD of FIG. 1a and the other based on a ACPC-SNSPD similar to the one illustrated in FIG. 2b. Like the ACPC-SNSPD illustrated in FIG. 2b, the ACPC-SNSPD used for establishing FIG. 3b is composed of 6 photosensitive sections as well as 14 current redistribution paths and the light, to which are exposed the photosensitive sections but not the current redistribution paths, is brought into the device by an optical fibre. The total area covered both by the single meander SNSPD and by the photosensitive sections of the ACPC-SNSPD used for establishing FIG. 3b is about 16 µm×16 µm. The comparison shown in FIG. 3b demonstrates that the ACPC-SNSPD according to the present invention can operate in high detection regime, whilst this isn't possible for the conventional single meander SNSPD. In fact, though a loss of efficiency is also observed for the ACPC-SNSPD according to the present invention, this loss is much lower than the one suffered by the conventional single meander SNSPD and prohibiting use of the latter at high detection rates.

Figure 3C:
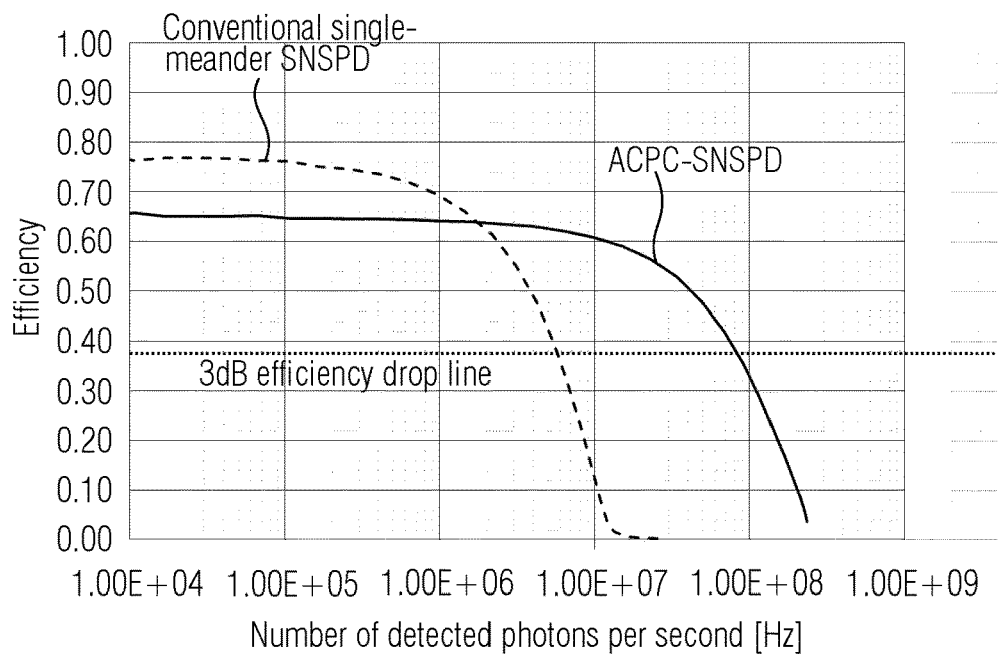

FIG. 3c shows the variation of the average detection efficiency per incident photon in dependence of the number of incident photons for a conventional single meander SNSPD and for an ACPC-SNSPD according to the present invention, with a continuous wave (CW) light source being used for illuminating the devices. The comparison shows that the detection efficiencies of a conventional single meander SNSPD similar to the one of FIG. 1a and of an ACPD-SNSPD are essentially constant when the photon count rate is below 1 MHz. In the example shown in FIG. 3c, the average detection efficiency per incident photon is about 77% for the single meander and about 66% for the ACPC-SNSPD for the regime of photon count rates below 1 MHz. As the photon count rate, i.e. the photon detection rate, increases, the average efficiency starts decreasing for both devices. However, the photon count rate at which the efficiency drops by half of the nominal efficiency, i.e. the 3 dB efficiency drop line, is situated already around 6 MHz for the conventional single meander SNSPD, but only around 70 MHz for the ACPC-SNSPD. This underlines that an ACPC-SNSPD according to the present invention may be used in particularly advantageous manner at high detection rates.

In light of the above description of the structure and of the operating mode of a device and a system according to the present invention, its advantages are clear. Primarily and most importantly, such a device allows, as main advantage of the proposed detector design, for operating SNSPDs having a plurality of parallelly connected nanowire sections at high detection rates whilst simultaneously avoiding current cross-talk and the corresponding cascading effect, which lead in prior art SNSPDs to a latched state, especially at high count rates. Second, a device according to the present invention allows the creation of larger sensitive surfaces for collection of light coming from large core optical fibres, for example from multimode optical fibres, or free-space propagating beams with corresponding advantages. Namely, the effective recovery time of the device according to the present invention is reduced as compared with a conventional single meander SNSPD covering the same large area and the yield of fabrication of the device, which reduces when the size of the optically sensitive area increases due to a larger probability of having a constriction in the meander, is less affected with the design according to the present invention, because a defective section, e.g. due to a fabrication problem, will not prevent the other photosensitive sections to operate. Third, a device and a system according to the present invention are particularly appropriate for applications in the fields of quantum key distribution, optical free-space communication and time of flight (TOF) measurements, such as for example Optical Time-Domain Reflectometry (OTDR), light detection and ranging (LiDAR). Finally, the device occupies comparatively low volume and its production is possible at sustainable cost, given that it doesn't require dedicated readout electronics or other expensive components for each nanowire section. The device thus allows to achieve the objectives set out above.

The invention claimed is:

1. A device for single photon detection, the device comprising:
    at least two superconducting detectors:
    a bias current source';
    a filter element; and
    a readout circuit;
    wherein each superconducting detector forms a detection area adapted for absorption of incident photons and is connected in parallel to said bias current source and to said readout circuit by the intermediate of said filter element, each superconducting detector being maintained at a temperature below its critical temperature, said bias current source providing each superconducting detector with an electrical bias current situated below a critical current of the superconducting detector such as to normally maintain each superconducting detector in a non-resistive superconducting state, each superconducting detector being adapted to transition, in case of absorption of an incident photon, from said non-resistive superconducting state to a resistive state, and said readout circuit being adapted to sense a voltage change corresponding to said transition of the superconducting detector into its resistive state, such as to allow to create an event signal for each absorption of an incident photon by any of said at least two superconducting detectors,
    wherein the device further comprises at least one current re-distributor adapted for at least partly redistributing current arising after absorption of incident photons by any of said superconducting detectors into said current re-distributor, such as to avoid any of the superconducting detectors not having absorbed an incident photon of having an increase in current density above its critical current.

2. The device according to claim 1, wherein the at least two superconducting detectors each comprise a superconducting nanowire section that has a geometric shape of a meander or any other shape covering the detection area, all of the at least two superconducting detectors comprising only a single piece.

3. The device according to claim 1, wherein the current re-distributor comprises a superconducting nanowire section that has a geometric shape of a meander or any other shape covering the detection area, the current re-distributor comprising only a single piece with the superconducting nanowire section forming one of the superconducting detectors.

4. The device according to claim 1 wherein the current re-distributor is adapted to support enough current to remain superconducting even if all of the superconducting detectors are in their resistive state, such as to avoid disablement of the superconducting detectors due to a current pile-up and/or cascade effect.

5. The device according to claim 1, wherein the current re-distributor is fabricated from a superconducting material different from a superconducting material used for fabrication of the superconducting detectors.

6. The device according to claim 1, wherein the current re-distributor has a minimum width ($W_R$) determined by the formula $W_R > W_S *[1+(N_s/N_R)]$, $N_S$ being a number of superconducting detectors of width $W_s$, and $N_R$ being a number of current re-distributors.

7. The device according to claim 1, wherein a number (NR) of current re-distributors is chosen such that a ratio $N_s/(N_R+N_s)$ is situated in a range between 5% to 50%, $N_S$ being a number of superconducting detectors.

8. The device according to claim 7, wherein the number ($N_R$) of current re-distributors is chosen such that the ratio $N_s/(N_R+N_s)$ is situated in the range 10% and 25%.

9. The device according to according to claim 1, wherein the shape and/or dimensions of the current re-distributor are chosen such as to select their respective kinetic inductance ($L_{KR}$), depending on the respective kinetic inductance ($L_K$) of the superconducting detectors.

10. The device according to claim 1, wherein the current re-distributor is arranged inside the device such as not to be exposed to incident photons and/or have a geometry having a width and/or a thickness, preventing the current redistributor from light detection even when exposed to light.

11. The device according to claim 1, wherein the device further comprises at least one control element each connected in series to a superconducting detector, respectively to a current redistributor, the control elements connected in series to the superconducting detector, respectively to the current redistributor.

12. The device according to claim 11, wherein the control elements comprise resistors.

13. The device according to claim 1, wherein the device is a chip or any type of integrated circuit.

14. The device according to claim 1, wherein the device further comprises a light source or an optical fibre allowing to bring light inside the device or that light is directed towards the device by free-space coupling.

15. A system for single photon detection, wherein the system comprises at least two devices according to claim 1, each device comprising a separate readout circuit.

16. A method comprising:
    selecting an application chosen from the group comprising Optical Time-Domain Reflectometry (OTDR), Light Detection and Ranging (LiDAR), Positron Emission Tomography (PET) scanner, and TOF camera; and
    determining quantum key distribution, optical free-space communication and TOF measurements for the selected application, using the system of claim 15.

17. A system, forming a large multi-pixel array, each pixel being formed by one of said devices of claim 1.

18. A method, comprising:
    selecting an application chosen from the group comprising Optical Time-Domain Reflectometry (OTDR), Light Detection and Ranging (LiDAR), Positron Emission Tomography (PET) scanner, and TOF camera; and
    determining quantum key distribution, optical free-space communication and TOF measurements for the selected application, using the device of claim 1.

* * * * *